United States Patent
Aritome

(10) Patent No.: US 7,539,052 B2
(45) Date of Patent: May 26, 2009

(54) NON-VOLATILE MULTILEVEL MEMORY CELL PROGRAMMING

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 11/646,815

(22) Filed: Dec. 28, 2006

(65) Prior Publication Data

US 2008/0158952 A1    Jul. 3, 2008

(51) Int. Cl.
G11C 16/04    (2006.01)

(52) U.S. Cl. .................. 365/185.03; 365/185.17; 365/185.24; 365/235; 365/185.22

(58) Field of Classification Search ............ 365/185.03, 365/185.17, 185.24, 235, 185.22, 185.12
See application file for complete search history.

(56) References Cited

U.S. PATENT DOCUMENTS

| | | | |
|---|---|---|---|
| 5,768,188 A * | 6/1998 | Park et al. ............... | 365/185.03 |
| 6,219,276 B1 | 4/2001 | Parker | |
| 6,522,580 B2 | 2/2003 | Chen et al. | |
| 6,538,923 B1 | 3/2003 | Parker | |
| 7,088,615 B2 | 8/2006 | Guterman et al. | |
| 7,095,654 B2 | 8/2006 | Quader et al. | |
| 2004/0170056 A1 | 9/2004 | Shibata et al. | |
| 2005/0007801 A1 * | 1/2005 | Barzilai et al. ................. | 365/10 |
| 2005/0083735 A1 * | 4/2005 | Chen et al. ............. | 365/185.17 |
| 2006/0050561 A1 * | 3/2006 | Guterman et al. ...... | 365/185.19 |
| 2006/0140002 A1 | 6/2006 | Kim et al. | |
| 2007/0206426 A1 * | 9/2007 | Mokhlesi ............... | 365/189.07 |

FOREIGN PATENT DOCUMENTS

| | | |
|---|---|---|
| EP | 0 797 212 A2 | 9/1997 |
| WO | 1997041640 A1 | 11/1997 |
| WO | 2006033099 A2 | 3/2006 |

OTHER PUBLICATIONS

International Search Report mailed May 9, 2008.

* cited by examiner

*Primary Examiner*—Thong Q Le
(74) *Attorney, Agent, or Firm*—Brooks, Cameron & Huebsch, PLLC

(57) ABSTRACT

Embodiments of the present disclosure provide methods, devices, modules, and systems for programming an array of non-volatile multilevel memory cells to a number of threshold voltage ranges. One method includes programming a lower page of a first wordline cell to increase a threshold voltage (Vt) of the first wordline cell to a first Vt within a lowermost Vt range. The method includes programming a lower page of a second wordline cell prior to programming an upper page of the first wordline cell. The method includes programming the upper page of the first wordline cell such that the first Vt is increased to a second Vt, wherein the second Vt is within a Vt range which is then a lowermost Vt range and is positive.

38 Claims, 11 Drawing Sheets

*Fig. 2C*

| FIG. 2C-1 | FIG. 2C-2 | FIG. 2C-3 | FIG. 2C-4 |

| | Program LP1~261 | | |
|---|---|---|---|
| | WL0 Program | Verify (272-1 Compaction) | Verify (272-2 Program Verify) |
| BL | 0V | 0V | 1V |
| SGD | 3.5V | 3.5V | 3.5V |
| WL31 | Vpass | Vread | Vread |
| WL30 | Vpass | Vread | Vread |
| • | • | • | • |
| • | • | • | • |
| • | • | • | • |
| WL3 | Vpass | Vread | Vread |
| WL2 | Vpass | Vread | Vread |
| WL1 | Vpass | Vread | Vread |
| WL0 | Vpgm (0.8V increments) | 0.3V | 1.0 V |
| SGS | 0V | 3.5V | 3.5V |
| SRC | 1.5V | 1.0V | 0V |
| | | | |
| a-tub | 0V | 0V | 0V |

*FIG. 2C-1*

| Program LP2 ~ 262 | | | | | |
|---|---|---|---|---|---|
| WL0 Program | Verify (274-1 Compaction) | Verify (274-2 Program Verify) | Verify (274-3 Program Verify) | Verify (274-4 Program Verify) |
| 0V | 0V | 1V | 1V | 1V |
| 3.5V | 3.5V | 3.5V | 3.5V | 3.5V |
| Vpass | Vread | Vread | Vread | Vread |
| Vpass | Vread | Vread | Vread | Vread |
| • | • | • | • | • |
| • | • | • | • | • |
| • | • | • | • | • |
| Vpass | Vread | Vread | Vread | Vread |
| Vpass | Vread | Vread | Vread | Vread |
| Vpass | Vread | Vread | Vread | Vread |
| Vpgm (0.4V increments) | 0.3V | 0.7V | 1.4V | 2.1V |
| 0V | 3.5V | 3.5V | 3.5V | 3.5V |
| 1.5V | 1.0V | 0V | 0V | 0V |
| 0V | 0V | 0V | 0V | 0V |

FIG. 2C-2

| Program LP3 ~ 263 | | | | |
|---|---|---|---|---|
| WL0 Program | Verify (276-1 Program Verify) | Verify (276-2 Program Verify) | ... | Verify (276-8 Program Verify) |
| 0V | 1V | 1V | ... | 1V |
| 3.5V | 3.5V | 3.5V | ... | 3.5V |
| Vpass | Vread | Vread | ... | Vread |
| Vpass | Vread | Vread | ... | Vread |
| • | • | • | ... | • |
| • | • | • | ... | • |
| • | • | • | ... | • |
| Vpass | Vread | Vread | ... | Vread |
| Vpass | Vread | Vread | ... | Vread |
| Vpass | Vread | Vread | ... | Vread |
| Vpgm (0.2V increments) | 0V | 0.23V | ... | 2.6V |
| 0V | 3.5V | 3.5V | ... | 3.5V |
| 1.5V | 0V | 0V | ... | 0V |
| 0V | 0V | 0V | ... | 0V |

FIG. 2C-3

| Program UP~265 | | | | |
|---|---|---|---|---|
| WL0 Program | Verify (278-1 Program Verify) | Verify (278-2 Program Verify) | ... | Verify (278-16 Program Verify) |
| 0V | 1V | 1V | ... | 1V |
| 3.5V | 3.5V | 3.5V | ... | 3.5V |
| Vpass | Vread | Vread | ... | Vread |
| Vpass | Vread | Vread | ... | Vread |
| • | • | • | ... | • |
| • | • | • | ... | • |
| • | • | • | ... | • |
| Vpass | Vread | Vread | ... | Vread |
| Vpass | Vread | Vread | ... | Vread |
| Vpass | Vread | Vread | ... | Vread |
| Vpgm (0.1V increments) | 0.25V | 0.45V | ... | 3.25V |
| 0V | 3.5V | 3.5V | ... | 3.5V |
| 1.5V | 0V | 0V | ... | 0V |
| 0V | 0V | 0V | ... | 0V |

*FIG. 2C-4*

|     | 307-0 EVEN | | | | 307-1 ODD | | | |
|-----|-----|-----|-----|-----|-----|-----|-----|-----|
|     | LP1 361 | LP2 362 | LP3 363 | UPPER 365 | LP1 361 | LP2 362 | LP3 363 | UPPER 365 |
| WL31 | 236 | 244 | 250 | 254 | 237 | 245 | 251 | 255 |
| WL30 | 228 | 238 | 246 | 252 | 229 | 239 | 247 | 253 |
| WL29 | 220 | 230 | 240 | 248 | 221 | 231 | 241 | 249 |
| WL28 | 212 | 222 | 232 | 242 | 211 | 223 | 233 | 243 |
| ... | ... | ... | ... | ... | ... | ... | ... | ... |
| WL8 | 52 | 62 | 72 | 82 | 53 | 63 | 73 | 83 |
| WL7 | 44 | 54 | 64 | 74 | 45 | 55 | 65 | 75 |
| WL6 | 36 | 46 | 56 | 66 | 37 | 47 | 57 | 67 |
| WL5 | 28 | 38 | 48 | 58 | 29 | 39 | 49 | 59 |
| WL4 | 20 | 30 | 40 | 50 | 21 | 31 | 41 | 51 |
| WL3 | 12 | 22 | 32 | 42 | 13 | 23 | 33 | 43 |
| WL2 | 6 | 14 | 24 | 34 | 7 | 15 | 25 | 35 |
| WL1 | 2 | 8 | 16 | 26 | 3 | 9 | 17 | 27 |
| WL0 | 0 | 4 | 10 | 18 | 1 | 5 | 11 | 19 |

Fig. 3A

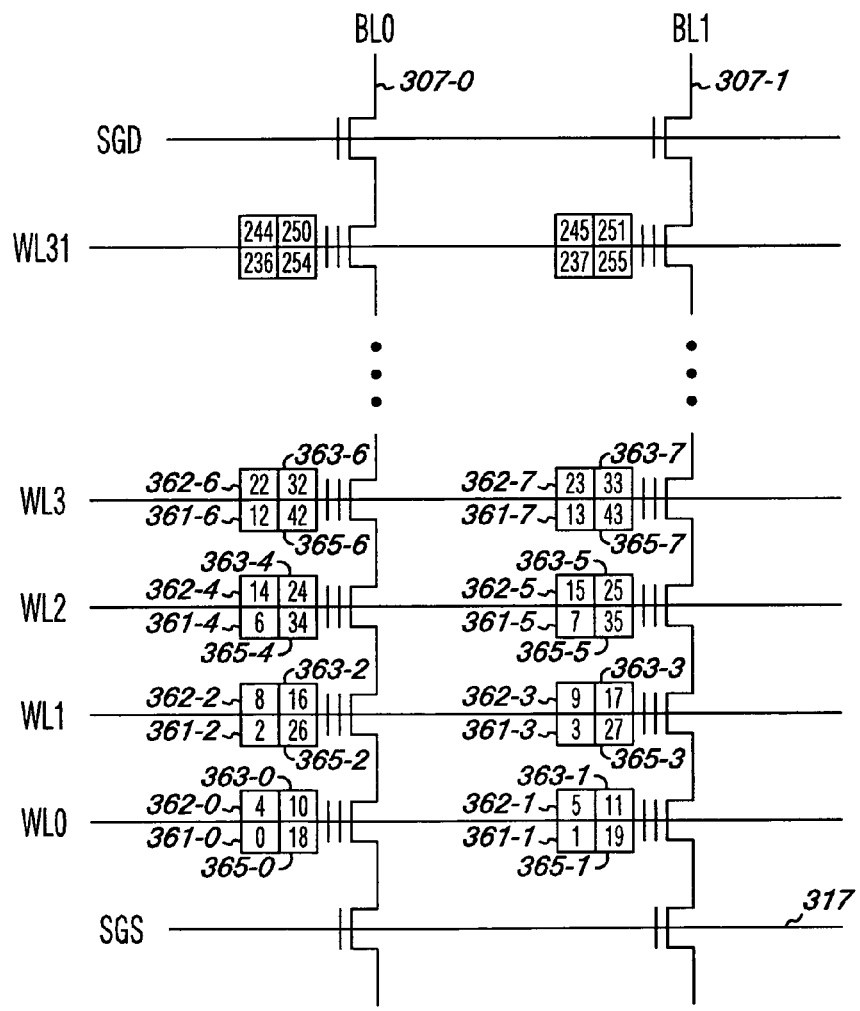
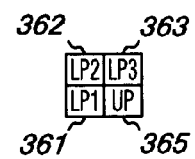
Fig. 3C
Fig. 3B

NON-VOLATILE MULTILEVEL MEMORY CELL PROGRAMMING

TECHNICAL FIELD

The present disclosure relates generally to semiconductor devices and, more particularly, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

As NAND flash memory is scaled, parasitic capacitance coupling between adjacent memory cell floating gates becomes a problem. Floating gate-to-floating gate interference can cause a wider Vt distribution when the distribution should be tighter. The wider distributions can result in a degraded programming performance as well as other problems.

These problems for single level cell (SLC) NAND array are even greater in a multiple level cell (MLC) NAND array. MLC memory stores multiple bits on each cell by using different threshold levels for each state that is stored. The difference between adjacent threshold voltage distributions may be very small as compared to an SLC memory device. Therefore, the effects of floating gate-to-floating gate coupling in an MLC device are greatly increased.

BRIEF DESCRIPTION OF THE DRAWINGS

FIG. 2C and FIGS. 2C-1 to 2C-4 illustrate a table showing operation voltages applied to various gates of a NAND string of non-volatile memory cells according to a programming embodiment of the present disclosure.

FIG. 3A illustrates a table of a programming sequence embodiment for programming a NAND array of four bit non-volatile memory cells on even and odd bit lines according to the present disclosure.

FIG. 3B illustrates an embodiment for programming a NAND array of four bit non-volatile memory cells on even and odd bit lines according to the programming sequence embodiment of FIG. 3A.

FIG. 3C illustrates a graphic to denote the various lower pages and the upper page as associated with each cell in the embodiment of FIG. 3B.

FIG. 4 is a functional block diagram of an electronic memory system having at least one memory device in accordance with an embodiment of the present disclosure.

DETAILED DESCRIPTION

Figure 1:
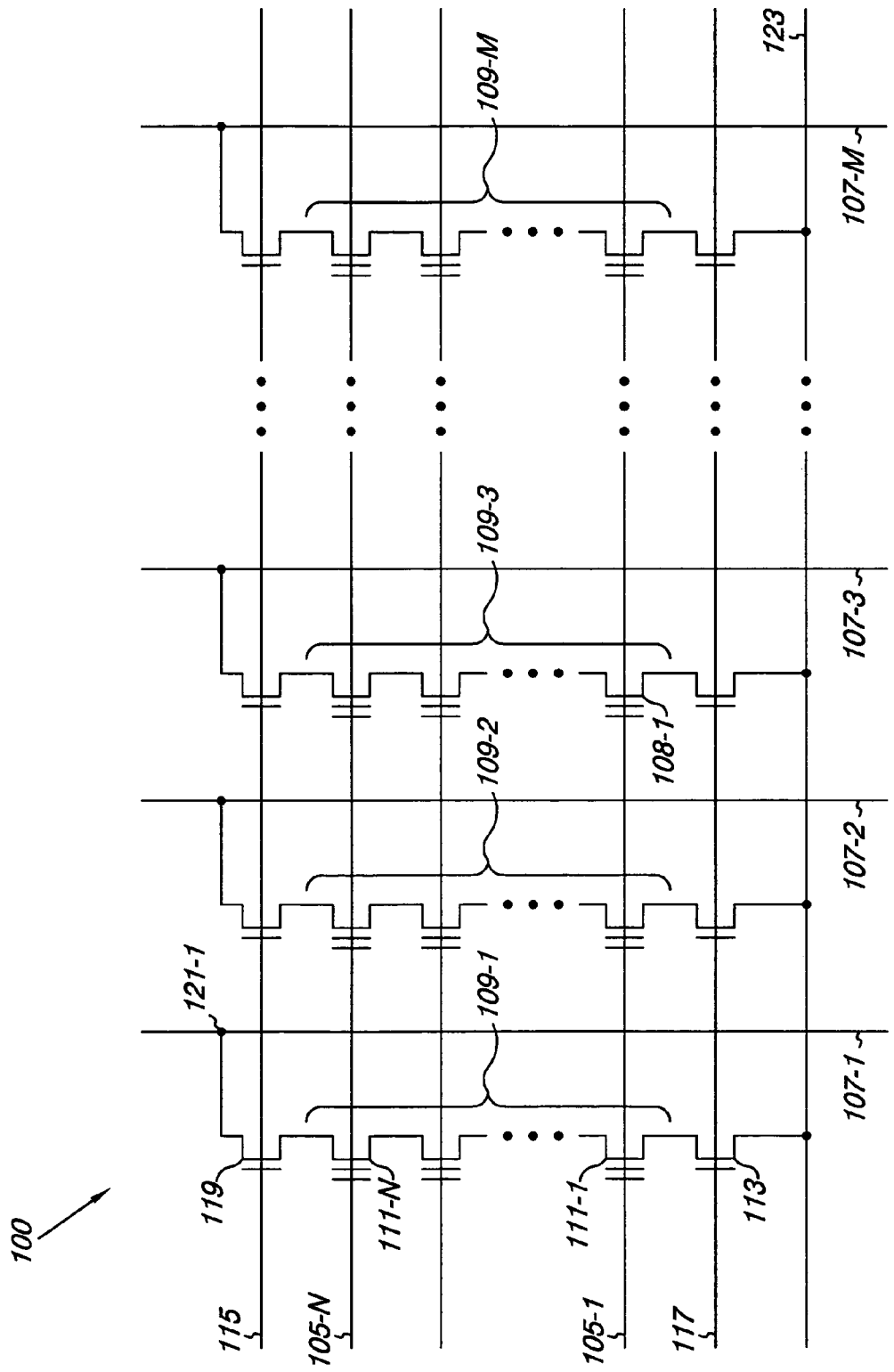
FIG. 1 is a schematic of a portion of a non-volatile memory array that can be used with embodiments of the present disclosure.

Embodiments of the present disclosure provide methods, devices, modules, and systems for programming non-volatile multilevel memory cells. One method embodiment includes programming an array of non-volatile multilevel memory cells to a number of threshold voltage ranges, where each of the number of threshold ranges represents a different logical state. The method includes programming a lower page of a first wordline cell to increase a threshold voltage (Vt) of the first wordline cell to a first Vt within a lowermost Vt range, programming a lower page of a second wordline cell prior to programming an upper page of the first wordline cell, and programming the upper page of the first wordline cell such that the first Vt is increased to a second Vt, wherein the second Vt is within a Vt range which is then a lowermost Vt range and is positive. As used herein, programming a "page" intends programming a memory cell to a threshold voltage level that is within a threshold voltage range of a group of threshold voltage ranges associated with a particular logical state.

In various embodiments of the present disclosure, each memory cell to be programmed is programmed from an initial threshold voltage that is not greater than zero volts, e.g., a ground potential, to a threshold voltage that is not less than zero volts. As described in detail below in connection with FIG. 2B, in such programming embodiments, eliminating cells having negative threshold voltages can reduce floating gate-to-floating gate interference. For example, programming processes that eliminate cells having negative threshold voltages can reduce the Vt difference and/or the verify voltage difference associated with programming cells from a lowermost negative threshold voltage range, e.g., a threshold voltage range corresponding to an erase state, to a lowermost positive threshold voltage range. As the reader will appreciate the larger Vt difference and/or the verify voltage difference associated with cells programmed from the erase state to a lowermost program state can cause greater floating gate-to-floating gate interference than the smaller Vt differences and/or verify voltage differences associated with cells programmed from the erase state to higher program states, e.g., higher threshold voltage ranges. That is, the Vt differences for cells programmed from the erase state to threshold voltage ranges corresponding to higher program states may be smaller than cells programmed from the erase state to a lowermost program state.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

FIG. 1 is a schematic of a portion of a non-volatile memory array 100 that can be used with embodiments of the present disclosure. The embodiment of FIG. 1 illustrates a NAND architecture non-volatile memory. However, embodiments described herein are not limited to this example. As shown in FIG. 1, the memory array 100 includes wordlines 105-1, . . . , 105-N and intersecting bit lines 107-1, . . . , 107-M. For ease of addressing in the digital environment, the number of wordlines 105-1, . . . , 105-N and the number of bit lines 107-1, . . . , 107-M are each some power of two, e.g., 256 wordlines by 4,096 bit lines.

Memory array 100 includes NAND strings 109-1, . . . , 109-M. Each NAND string includes non-volatile memory cells 111-1, . . . , 111-N, each located at an intersection of a wordline 105-1, . . . , 105-N and a local bit line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In various embodiments, construction of non-volatile memory cells, 111-1, . . . , 111-N, includes a source, a drain, a floating gate or charge storage layer, and a control gate. Non-volatile memory cells, 111-1, . . . , 111-N, have their control gates coupled to a wordline, 105-1, . . . , 105-N respectively. A column of the non-volatile memory cells, 111-1, . . . , 111-N, make up the NAND strings, e.g., 109-1, . . . , 109-M, coupled to a given local bit line, e.g., 107-1, . . . , 107-M respectively. A row of the non-volatile memory cells are commonly coupled to a given wordline, e.g., 105-1, . . . , 105-N. An AND array architecture would be similarly laid out except that the string of memory cells would be coupled in parallel between the select gates.

Figure 2A:
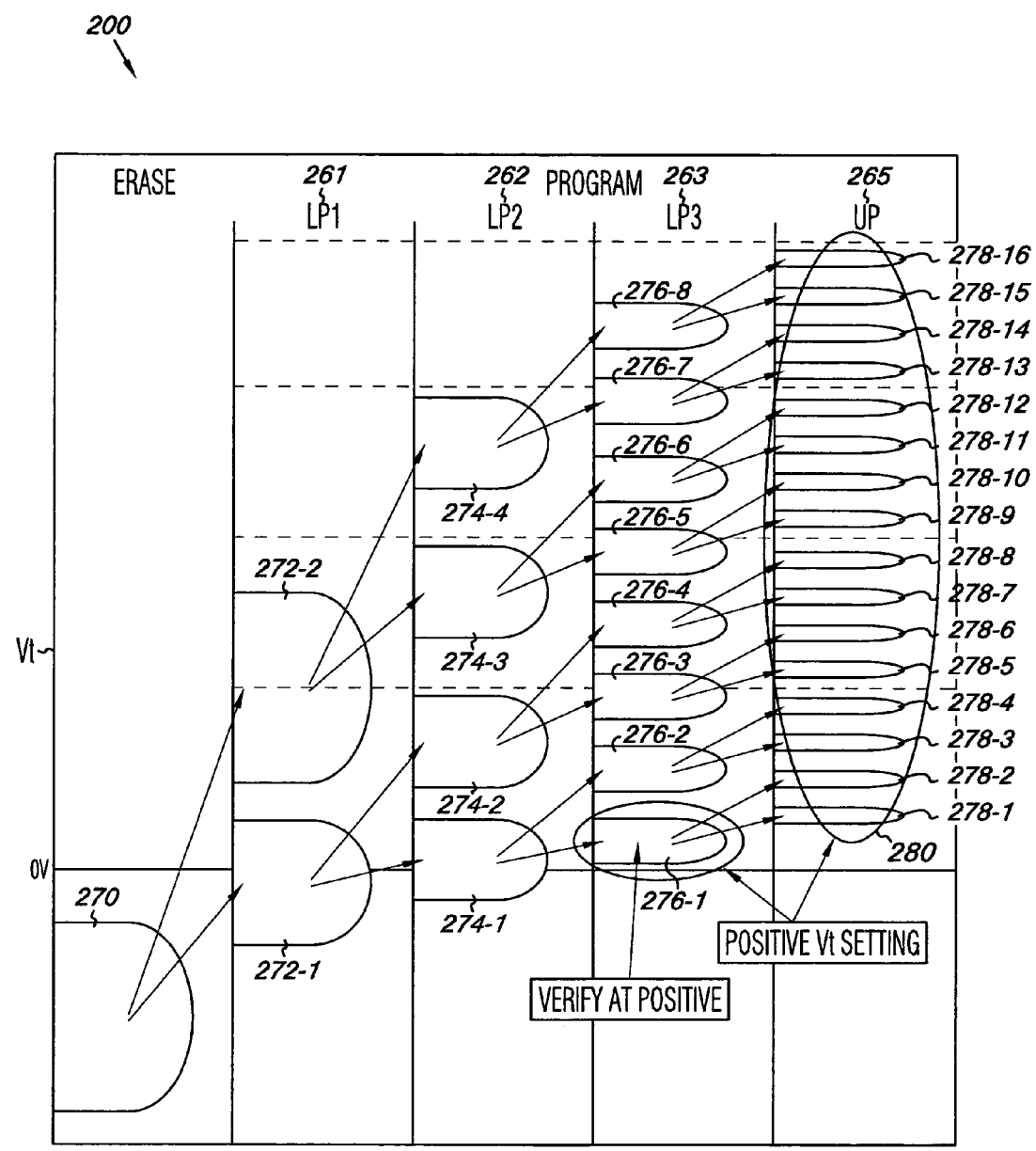
FIG. 2A illustrates a diagram of Vt distributions associated with a programming sequence embodiment of the present disclosure.
Figure 2B:
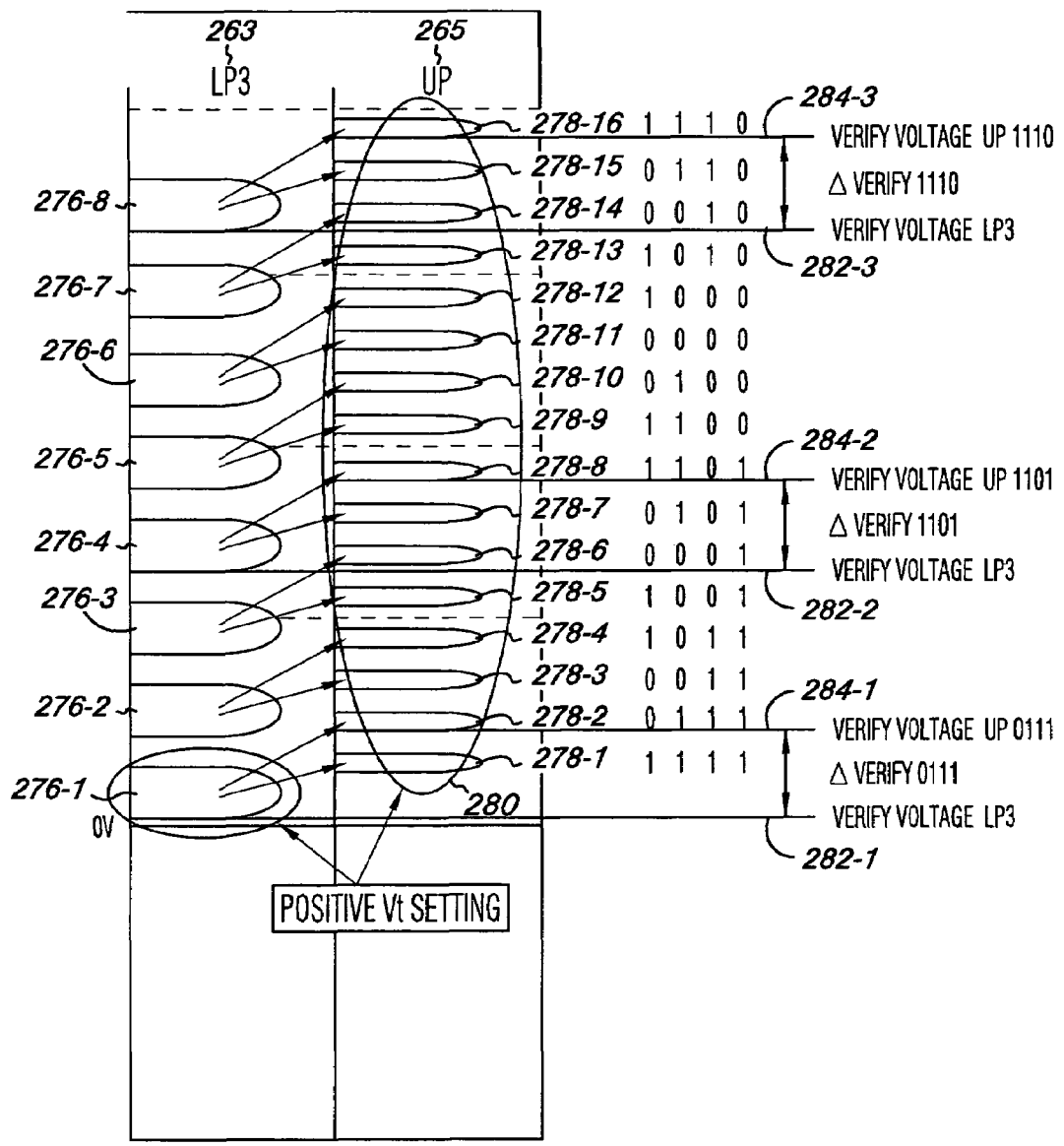
FIG. 2B illustrates the diagram of Vt distributions of FIG. 2A after the third lower page programming process (LP3) and after the upper page programming process (UP) along with corresponding four bit logical states.

FIGS. 2A and 2B illustrate voltage threshold (Vt) distributions, e.g., Vt ranges, of memory cells in an array of non-volatile memory cells, e.g., array 100 in FIG. 1. FIG. 2A illustrates Vt distributions of the memory cells after a first lower page programming process 261 (LP1), a second lower page programming process 262 (LP2), a third lower page programming process 263 (LP3), and an upper page programming process 265 (UP) associated with a programming sequence embodiment 200. FIG. 2B illustrates the Vt distributions of FIG. 2A after the third lower page programming process 263 (LP3) and the upper page programming process 265 (UP). After the programming sequence embodiment 200 illustrated in FIG. 2A, and as discussed below in connection with FIGS. 3A and 3B, each of the memory cells of a physical page of data are programmed to one of sixteen logical states. That is, in this embodiment, each memory cell is assumed to be a four-bit MLC. However, embodiments of the present disclosure are not limited to MLCs representing 4 bits/cell, e.g., in some embodiments the MLCs may represent more or fewer than 4 bits/cell.

In the embodiment illustrated in FIG. 2A, the first lower page programming 261 is performed first and the upper page programming process 265 is performed last. That is, logical lower pages are programmed prior to logical upper pages. However, embodiments are not so limited. For example, in some embodiments, the first logical lower page may be referred to as an "upper page" or as a "first lower page" since in some embodiments the logical upper pages can be programmed first and the first logical lower pages can be programmed last.

As shown in the embodiment of FIG. 2A, each of the memory cells have threshold voltage (Vt) levels within a first Vt distribution 270, or initial Vt range, corresponding to an erase state, e.g., logical state "1111" in this example, prior to the page programming sequence illustrated. That is, the memory cells are programmed from the erase state. In this example, the cells are programmed from a Vt level of not more than zero volts, e.g., a ground potential, to a Vt level not less than zero volts within one of a number of different Vt ranges 278-1 to 278-16, each representing a different 4 bit logical state.

In this embodiment, first lower page programming 261 shifts the Vt levels of memory cells within distribution 270 such that some of the memory cells have Vt levels within distribution 272-1 and some have Vt levels within distribution 272-2. In this embodiment, and as illustrated more clearly in FIG. 2B, the cells having Vt levels within distribution 272-1 after first lower page programming 261 are cells which are to be programmed to logical states "1111," "0111," "0011," "1011," "1001," "0001," "0101," and "1101," which correspond to Vt distributions 278-1, 278-2, 278-3, 278-4, 278-5, 278-6, 278-7, and 278-8, respectively. Similarly, the cells having Vt levels within distribution 272-2 after first lower page programming 261 are cells which are to be programmed to logical states "1100," "0100," "0000," "1000," "1010," "0010," "0110," and "1110," which correspond to Vt distributions 278-9, 278-10, 278-11, 278-12, 278-13, 278-14, 278-15, and 278-16, respectively.

In the embodiment illustrated in FIG. 2A, second lower page programming 262 (LP2) shifts the Vt levels of memory cells within distributions 272-1 and 272-2. As shown in FIG.

2A, the second lower page programming 262 shifts the Vt of memory cells within distribution 272-1 such that some of the memory cells have Vt levels within distribution 274-1 and some have Vt levels within distribution 274-2. Similarly, the second lower page programming 262 shifts the Vt of memory cells within distribution 272-2 such that some of the memory cells have Vt levels within distribution 274-3 and some have Vt levels within distribution 274-4. In this embodiment, and as illustrated more clearly in FIG. 2B, the cells having Vt levels within distribution 274-1 after second lower page programming 262 are cells which are to be programmed to logical states "1111," "0111," "0011," and "1011," which correspond to Vt distributions 278-1, 278-2, 278-3, and 278-4, respectively. Similarly, the cells having Vt levels within distribution 274-2 after second lower page programming 262 are cells which are to be programmed to logical states "1001," "0001," "0101," and "1101," which correspond to Vt distributions 278-5, 278-6, 278-7, and 278-8, respectively. Similarly, the cells having Vt levels within distribution 274-3 after second lower page programming 262 are cells which are to be programmed to logical states "1100," "0100," "0000," and "1000," which correspond to Vt distributions 278-9, 278-10, 278-11, and 278-12, respectively. Also, the cells having Vt levels within distribution 274-4 after second lower page programming 262 are cells which are to be programmed to logical states "1010," "0010," "0110," and "1110," which correspond to Vt distributions 278-13, 278-14, 278-15, and 278-16, respectively.

In the embodiment illustrated in FIG. 2A, third lower page programming 263 (LP3) shifts the Vt levels of memory cells within distributions 274-1, 274-2, 274-3, and 274-4. As shown in FIG. 2A, the third lower page programming 263 shifts the Vt of memory cells within distribution 274-1 such that some of the memory cells have Vt levels within distribution 276-1 and some have Vt levels within distribution 276-2. Similarly, the third lower page programming 263 shifts the Vt of memory cells within distribution 274-2 such that some of the memory cells have Vt levels within distribution 276-3 and some have Vt levels within distribution 276-4. Also, the third lower page programming 263 shifts the Vt of memory cells within distribution 274-3 such that some of the memory cells have Vt levels within distribution 276-5 and some have Vt levels within distribution 276-6, and shifts the Vt of memory cells within distribution 274-4 such that some of the memory cells have Vt levels within distribution 276-7 and some have Vt levels within distribution 276-8.

As illustrated in the embodiment shown in FIGS. 2A and 2B, each of the memory cells being programmed into one of the sixteen logical states has a positive Vt after the third lower page programming process 263. That is, in this example, the verify voltage corresponding to each of the Vt distributions 276-1 to 276-8 is greater than 0V. For example, as shown in the embodiment of FIG. 2B, the verify voltage 282-1 corresponding to cells having Vts within the lowermost Vt distribution 276-1 after third lower page programming 263 is greater than 0V.

In this embodiment, and as illustrated more clearly in FIG. 2B, the cells having Vt levels within distribution 276-1 after third lower page programming 263 are cells which are to be programmed to logical states "1111" and "0111," which correspond to Vt distributions 278-1 and 278-2, respectively. Similarly, the cells having Vt levels within distribution 276-2 after third lower page programming 263 are cells which are to be programmed to logical states "0011" and "1011," which correspond to Vt distributions 278-3 and 278-4, respectively. Also, the cells having Vt levels within distribution 276-3 after third lower page programming 263 are cells which are to be programmed to logical states "1001" and "0001," which correspond to Vt distributions 278-5 and 278-6, respectively. The cells having Vt levels within distribution 276-4 after third lower page programming 263 are cells which are to be programmed to logical states "0101" and "1101," which correspond to Vt distributions 278-7 and 278-8, respectively. In a like manner, the cells having Vt levels within distribution 276-5 after third lower page programming 263 are cells which are to be programmed to logical states "1100" and "0100," which correspond to Vt distributions 278-9 and 278-10, respectively. The cells having Vt levels within distribution 276-6 after third lower page programming 263 are cells which are to be programmed to logical states "0000" and "1000," which correspond to Vt distributions 278-11 and 278-12, respectively. Also, the cells having Vt levels within distribution 276-7 after third lower page programming 263 are cells which are to be programmed to logical states "1010" and "0010," which correspond to Vt distributions 278-13 and 278-14, respectively. Similarly, the cells having Vt levels within distribution 276-8 after third lower page programming 263 are cells which are to be programmed to logical states "0110" and "1110," which correspond to Vt distributions 278-15 and 278-16, respectively.

In the embodiment illustrated in FIG. 2A, upper page programming 265 (UP) shifts the Vt levels of memory cells within distributions 276-1, 276-2, 276-3, 276-4, 276-5, 276-6, 276-7, and 276-8. As shown in FIG. 2A, the upper page programming 265 shifts the Vt of memory cells within distribution 276-1 such that some of the memory cells have Vt levels within distribution 278-1 and some have Vt levels within distribution 278-2. That is, memory cells that have a Vt within distribution 276-1 after third lower page programming 263 are programmed such that they have a Vt within distribution 278-1, e.g., "1111" logical state as shown in FIG. 2B, or within distribution 278-2, e.g., "0111" logical state as shown in FIG. 2B.

Similarly, the upper page programming 265 shifts the Vt of memory cells within distribution 276-2 such that some of the memory cells have Vt levels within distribution 278-3 and some have Vt levels within distribution 278-4. Also, the upper page programming 263 shifts the Vt of memory cells within distribution 276-3 such that some of the memory cells have Vt levels within distribution 278-5 and some have Vt levels within distribution 278-6, and shifts the Vt of memory cells within distribution 276-4 such that some of the memory cells have Vt levels within distribution 278-7 and some have Vt levels within distribution 278-8.

In the embodiment illustrated in FIGS. 2A and 2B, each of the memory cells being programmed has a Vt greater than zero volts after third lower page programming 263, e.g., each Vt range 276-1 to 276-8 has a verify voltage not less than zero volts. That is, in this embodiment, programming pulses are applied to the control gates of memory cells being programmed from Vt range 274-1 during third lower page programming 263 until each cell's Vt is verified to be not less than zero volts. As one of ordinary skill in the art will appreciate, an inhibit voltage, such as Vcc, can be applied to a bit line associated with cells that have reached a desired Vt level, e.g., cells having a Vt within a desired Vt range, such that those cells are not further programmed to higher Vt levels or higher Vt ranges.

Embodiments are not limited to the example shown in FIGS. 2A and 2B. For instance, in some embodiments, programming voltage pulses can be applied to the control gates of cells being programmed from Vt range 270 to Vt range 272-1 during first lower page programming 261 such that each cell within Vt range 272-1 has a positive Vt level after first lower page programming 261. Similarly, in some embodiments, programming pulses can be applied to the control gates of cells being programmed from a Vt level within Vt range 272-1 to a Vt level within Vt range 274-1 during second lower page programming 262 which cause each cell within Vt range 274-1 to reach a positive Vt level after second lower page programming 262.

Also, in some embodiments, programming pulses can be applied to the control gates of cells being programmed from an initial Vt level within a range 270 of negative Vt levels, e.g., an erase Vt, to a Vt within one of a first or second lowermost positive Vt range 278-1 or 278-2 during upper page programming 265 such that none of the Vt ranges 272-1, 274-1, or 276-1 include only cells having positive Vt levels. That is, the verify voltage levels associated with Vt ranges 272-1, 274-1, and 276-1 may not be greater than zero volts until after upper page programming 265.

As described further in connection with FIGS. 2C and 2C-1 to 2C-4 below, programming pulses can be applied to the control gates of those memory cells that are to remain in a lowermost Vt range, e.g., ranges 270, 272-1, 274-1, 276-1, and 278-1, to compact the lowermost Vt range. Compaction can refer to the upward shift and/or narrowing of the lowermost Vt range during first lower page, second lower page, third lower page, and/or upper page programming. In various embodiments, and as shown in FIGS. 2C-1 to 2C-4, the Vt level of memory cells within lowermost Vt ranges 272-1, 274-1, 276-1, and 278-1 are verified via different verify operations which can depend on whether the verify voltage of the respective lowermost Vt range is greater than or less than zero volts, e.g., a ground potential, during the respective programming 261, 262, 263, and 265. For instance, in various embodiments, a compaction verify operation is used to verify the Vt level of cells within a lowermost Vt range, e.g., 272-1, 274-1, 276-1, and 278-1, if the verify voltage associated with the lowermost Vt range is less than zero volts during the respective programming, e.g., 261, 262, 263, and 265. In such embodiments, a programming verify operation is used to verify the Vt level of cells within a lowermost Vt range, e.g., 272-1, 274-1, 276-1, and 278-1, if the verify voltage associated with the lowermost Vt range is not less than zero volts during the respective programming, e.g., 261, 262, 263, and 265.

For example, with respect to the embodiment illustrated in FIG. 2A, a first compaction verify operation is performed during first lower page programming 261 to verify the Vt level of cells within lowermost Vt range 272-1, which has a verify voltage less than zero volts as shown. Similarly, a second compaction verify operation is performed during second lower page programming 262 to verify the Vt level of cells within lowermost Vt range 274-1, which also has a verify voltage less than zero volts as shown. In the embodiment shown in FIG. 2A, a program verify operation is used to verify the Vt level of cells within lowermost Vt range 276-1, which has a verify voltage 282-1 not less than zero volts as shown in FIG. 2B. Example operation voltages applied to a NAND array of non-volatile memory cells during compaction verify operations and program verify operations are shown in FIGS. 2C and 2C-1 to 2C-4.

In various embodiments of the present disclosure, the Vt level of memory cells within Vt ranges other than the lowermost Vt range, e.g., 272-1, 274-1, 276-1, and 278-1 are verified via a program verify operation since each Vt range higher than a lowermost Vt range has a verify voltage not less than zero volts.

FIG. 2B illustrates the Vt distributions of FIG. 2A after the third lower page programming process 263 (LP3) and the upper page programming process 265 (UP) according to an embodiment of the present disclosure. As illustrated in FIG. 2B, various programming embodiments of the present disclosure can provide for Vt level shifts from third page programming 263 to upper page programming 265 that are substantially uniform. That is, the voltage difference between the verify voltage associated with a particular Vt range, e.g., 276-1 to 276-8, after third lower page programming 263 and the higher verify voltage associated with the two corresponding upper page Vt ranges, e.g., 278-1/278-2 for 276-1 and 218-15/278-16 for 276-8, are approximately equal.

For example, as shown in FIG. 2B, the voltage difference between verify voltage 282-3 associated with Vt range 276-8 and verify voltage 284-3 associated with Vt range 278-16 is approximately equal to the voltage difference between verify voltages 284-2 and 282-2, which is approximately equal to the voltage difference between verify voltages 284-1 and 282-1. Examples of verify voltage differences include, but are not limited to, 0.5 volts, 0.6 volts, 0.7 volts, and 0.8 volts. Examples of verify voltage levels associated with the Vt distributions in FIGS. 2A and 2B shown in FIGS. 2C-1 to 2C-4 and described below. Reducing the magnitude of Vt level shifts, e.g., Vt range shifts, associated with programming an upper page of a memory cell after a lower page programming can reduce floating gate-to-floating gate interference among memory cells, e.g., adjacent cells on a wordline and/or cells on adjacent wordlines. For instance, a large Vt shift associated with programming a cell from one of the Vt ranges 276-1 to 276-8 to corresponding Vt ranges 278-1 to 278-16 can cause Vt changes to neighboring cells via floating gate-to-floating gate interference.

Various programming embodiments of the present disclosure shift the Vt of each memory cell from a voltage less than zero volts, e.g., an erase Vt, to a voltage of at least zero volts. That is, each of the sixteen binary states which the four bit MLC can represent has a corresponding Vt range, e.g., 278-1 to 278-16, having a verify voltage of not less than zero volts. The absence of cells having negative Vts after upper page programming 265 can reduce floating gate-to-floating gate interference. For example, if the verify voltage 282-1 associated with lowermost Vt range 276-1 in FIG. 2B were less than zero volts, then the voltage difference between third lower page programming 263 and upper page programming 265 would be increased, e.g., the difference between verify voltage 284-1 and 282-1 would be greater than that shown in FIG. 2B. The increased verify voltage difference from third lower page programming 263 to upper page programming 265 can increase floating gate-to-floating gate interference as described above.

FIGS. 2C and 2C-1 to 2C-4 illustrate a table showing operation voltages applied to various gates of a NAND string of non-volatile memory cells, e.g., NAND strings 109-1 to 109-M shown in FIG. 1, according to a programming embodiment of the present disclosure. FIGS. 2C-1 to 2C-4 illustrate example operation voltages associated with programming and verifying non-volatile memory cells from an erase Vt range, e.g., Vt range 270, to one of a number of positive Vt ranges, e.g., Vt ranges 280, as shown in FIG. 2A. That is, FIG. 2C-1 represents example operation voltages for first lower page programming 261, FIG. 2C-2 represents example operation voltages for second lower page programming 262, FIG. 2C-3 represents example operation voltages for third lower page programming 263, and FIG. 2C-4 represents example operation voltages for upper page programming 265, which results in the Vt distribution shown in FIGS. 2A and 2B.

In the embodiment illustrated in FIGS. 2C-1 to 2C-4, the NAND array includes 32 wordlines (WL0 to WL31 as shown); however, embodiments are not limited to the number of wordlines, e.g., the NAND array can include more or fewer than 32 wordlines. Also, it is noted that the operation voltages shown in FIGS. 2C-1 to 2C-4 illustrate program and verify voltages associated with programming memory cells on a single wordline, e.g., WL0 in this example. As the reader will appreciate, the operation voltages would be similar for programming cells on the other wordlines, e.g., WL1 to WL31.

FIG. 2C-1 illustrates example operation voltages for programming a first logical lower page of memory cells on WL0. During each of first, second, and third lower page programming 261, 262, and 263 and upper page programming 265, a programming voltage (Vpgm as shown) is applied to memory cells on a selected wordline, e.g., WL0 in this example, while a pass voltage (Vpass as shown) is applied to unselected wordlines, e.g., WL1 to WL31 in this example. As one of ordinary skill in the art will appreciate, Vpgm can be a number of incremented programming pulses having a starting potential of around 12-14 volts, for example. The Vpgm pulses can be incremented with a step size of between about 0.1 to 0.8, which can depend on various factors such as the narrowness of the Vt ranges or the voltage margin between Vt ranges, among other factors. For instance, the step size for Vpgm pulses can be smaller for upper page programming 265 than for first, second, and/or third lower page programming 261, 262, and/or 263 to account for the narrowness of the Vt ranges and/or read margins between them. As one example, and as shown in FIGS. 2C-1 to 2C-4, the programming voltage (Vpgm) pulses for a first lower page programming operation, e.g., 261, can be incremented by about 0.8 volts, the Vpgm pulses for a second lower page programming operation, e.g., 262, can be incremented by about 0.4 volts, the Vpgm pulses for a third lower page programming operation, e.g., 263, can be incremented by about 0.2 volts, and the Vpgm pulses for an upper page programming operation, e.g., 265, can be incremented by about 0.1 volts. Embodiments are not limited to these example increments between Vpgm voltage pulses.

The Vpgm pulses are applied to the control gates of cells being programmed until the Vt of the cell has reached a desired Vt level as determined by a verify operation, at which point a voltage such as a Vcc voltage is applied to bit lines of cells at the desired Vt level to "inhibit" further increase of the Vt of those cells. As one of ordinary skill in the art will appreciate, verify operations occur between the Vpgm pulses.

The embodiment illustrated in FIG. 2C-1 includes performing a compaction verify operation (shown as 272-1 Compaction) for memory cells whose Vt level is to remain in lowermost Vt range 272-1 after first lower page programming 261. In this example, the compaction verify operation includes applying zero volts to the bit line associated with the memory cell, applying 1.0 volts to the source line (SRC), applying a read potential (Vread), e.g., 3.5 volts, to the unselected wordlines, the source select gate (SGS), and the drain select gate (SGD), and applying 0.3 volts to the selected wordline WL0, e.g., to the control gate of the memory cell.

The embodiment illustrated in FIG. 2C-1, includes performing a program verify operation (shown as 272-2 Program Verify) for memory cells whose Vt level is to be shifted to within Vt range 272-2 after first lower page programming 261. In this example, the program verify operation includes applying 1.0 volts to the bit line associated with the memory cell, applying zero volts to the source line (SRC), applying a read potential (Vread), e.g., 3.5 volts, to the unselected wordlines, the source select gate (SGS), and the drain select gate (SGD), and applying 1.0 volts to the selected wordline WL0, e.g., to the control gate of the memory cell. As the reader will appreciate, the voltage applied to the control gate, e.g., 1.0 volts in this case, corresponds with the lowermost Vt level associated with Vt range 272-2.

The differences between the compaction verify operation (272-1 Compaction) and the program verify operation (Program Verify 272-2) occur due to the fact that the Vt range 272-1 includes at least some cells having Vt levels less than zero volts after first lower page programming 261. For instance, in various embodiments, the voltage applied to memory cell control gates during program and/or verify operations is zero volts or greater, e.g., the minimum applied control gate voltage is 0 volts. In such embodiments, the Vt of cells having negative Vt levels may not be able to be determined due to those memory cells being "ON" during the verify operation. That is, the cells have a Vt less than the minimum applied control gate voltage, e.g., 0 volts in this example. One of ordinary skill in the art will appreciate that negative voltages can be applied to memory cell control gates during program and/or verify operations. As described in connection with FIGS. 2C-3 and 2C-4, memory cells programmed out of lowermost Vt ranges, e.g., 274-1 and 276-1, are verified during corresponding page programming, e.g., 263 and 265, via a respective program verify operation instead of compaction verify operations since each cell within the lowermost Vt range, e.g., 276-1 and 278-1, has a Vt level not less than zero volts.

FIG. 2C-2 illustrates example operation voltages for programming a second logical lower page of memory cells on WL0. The embodiment illustrated in FIG. 2C-2 includes performing a compaction verify operation (shown as 274-1 Compaction) for memory cells whose Vt level is to remain in lowermost Vt range 274-1 after second lower page programming 262, e.g., cells programmed from out of lowermost Vt range 272-1 to lowermost Vt range 274-1. In this example, the compaction verify operation includes applying zero volts to the bit line associated with the memory cell, applying 1.0 volts to the source line (SRC), applying a read potential (Vread), e.g., 3.5 volts, to the unselected wordlines, the source select gate (SGS), and the drain select gate (SGD), and applying 0.3 volts to the selected wordline WL0, e.g., to the control gate of the memory cell.

The embodiment illustrated in FIG. 2C-2, includes performing program verify operations (shown as 274-2 Program Verify, . . . , 274-4 Program Verify) for memory cells whose Vt level is to be programmed to within a Vt range other than the lowermost Vt range 274-1 after second lower page programming 262. In this example, the program verify operations are similar to 272-2 Program Verify shown in FIG. 2C-1 except for the control gate voltages, e.g., the WL0 voltage, applied to the cells during respective verify operations. For instance, in the embodiment of FIG. 2C-2, the control gate voltage applied to cells being verified to have a Vt level within Vt range 274-2 is 0.7 volts, the control gate voltage applied to cells being verified to have a Vt level within Vt range 274-3 is 1.4 volts, and the control gate voltage applied to cells being verified to have a Vt level within Vt range 274-4 is 2.1 volts. As the reader will appreciate, the applied control gate voltages correspond with the verify voltage, e.g., the lowermost Vt level, associated with the respective Vt ranges.

FIG. 2C-3 illustrates example operation voltages for programming a third logical lower page of memory cells on WL0. The embodiment illustrated in FIG. 2C-3 includes performing a program verify operation on each of the cells being programmed from Vt levels within one of Vt ranges 274-1 to 274-4 to Vt levels within one of Vt ranges 276-1 to 276-8 after third lower page programming 263. In the embodiment of FIG. 2C-3, a compaction verify operation as described in connection with FIGS. 2C-1 and 2C-2 is not performed on cells programmed from lowermost Vt range 274-1 to lowermost Vt range 276-1. That is, in this embodiment, third lower page programming 263 includes applying a number of programming voltage pulses, e.g., Vpgm, to WL0 until the cells to be programmed to a Vt within the lowermost Vt range 276-1 reach a Vt level not less than zero volts, e.g., a positive Vt level. As shown in FIG. 2C-3, the verification operation associated with the lowermost Vt range 276-1, e.g., 276-1 Program Verify, includes applying zero volts to the control gates of cells being programmed to Vt levels within lowermost Vt range 276-1. The verification operations associated with Vt ranges other than the lowermost Vt range 276-1, e.g., 276-2 Program Verify, 276-3 Program Verify, . . . , 276-8 Program Verify, include applying increasingly positive voltages to the control gates of memory cells being programmed to Vt levels within respective Vt ranges 276-2 to 276-8.

FIG. 2C-4 illustrates example operation voltages for programming an upper page of memory cells on WL0. Similar to the embodiment in FIG. 2C-3, the embodiment illustrated in FIG. 2C-4 includes performing a program verify operation on each of the cells being programmed from Vt levels within one of Vt ranges 276-1 to 276-8 to Vt levels within one of Vt ranges 278-1 to 278-16 after upper page programming 265. In the embodiment of FIG. 2C-4, a compaction verify operation as described in connection with FIGS. 2C-1 and 2C-2 is not performed on cells programmed from lowermost Vt range 276-1 to lowermost Vt range 278-1. That is, in this embodiment, upper page programming 265 includes applying a number of programming voltage pulses, e.g., Vpgm, to WL0 until the cells to be programmed to a Vt within the lowermost Vt range 278-1 reach a Vt level not less than zero volts, e.g., a positive Vt level. As shown in FIG. 2C-4, the verification operation associated with the lowermost Vt range 278-1, e.g., 278-1 Program Verify, includes applying 0.25 volts to the control gates of cells being programmed to Vt levels within lowermost Vt range 278-1. It is noted that this control gate voltage, e.g., 0.25 volts, applied to memory cells during 278-1 Program Verify is greater than the control gate voltage, e.g., zero volts, applied to the memory cells during 276-1 Program Verify due to the upward shift of the lowermost Vt range 278-1 from third lower page programming 263 to upper page programming 265 as shown in FIGS. 2A and 2B.

The verification operations associated with Vt ranges other than the lowermost Vt range 278-1, e.g., 278-2 Program Verify, 278-3 Program Verify, . . . , 278-16 Program Verify, include applying increasingly positive voltages to the control gates of memory cells being programmed to Vt levels within respective Vt ranges 278-2 to 278-16.

As previously noted above, programming each of the memory cells from a Vt level within a range of negative Vt levels, e.g., an erase Vt range 270, to a Vt level within a range of positive Vt levels can reduce floating gate-to-floating gate interference associated with cells being programmed from the erase state to a lowermost program state. For example, in various programming embodiments of the present disclosure, the erase state, e.g., a negative Vt range, is eliminated such that the relatively larger verify voltage difference associated with cells programmed from the erase state to a lowermost program state, e.g., Vt range 278-1, is reduced.

FIG. 3A illustrates a table of a programming sequence embodiment for programming a NAND array of four bit non-volatile memory cells on even and odd bit lines according to the present disclosure.

As shown in the embodiment of FIG. 3A, a number of wordlines, e.g., WL0 through WL31 are associated with even and odd bit lines 307-0 and 307-1. In one embodiment, programming is started from the bottom of the array with a wordline that is adjacent to the source line of a particular block of non-volatile memory cells. In the illustrated embodiment, the adjacent wordline is WL0. In the embodiment, programming proceeds upward from WL0 to WL1, WL2, . . . WL31, etc. The memory cells of the embodiment of FIG. 3A are multilevel cells (MLC) that each store four data bits. The table embodiment of FIG. 3A illustrates a programming order of each data bit. The embodiment illustrates, programming a first lower page (e.g., LP1), programming a second lower page (e.g., LP2), programming a third lower page (e.g., LP3), and programming an upper page (e.g., UPPER), of a cell.

As shown in the programming table embodiment, the method includes programming the first, the second, and the third lower pages (e.g., LP1, LP2, LP3) and the upper page (e.g., UPPER) in association with an even bit line 307-0 (EVEN) and an odd bit line 307-1 (ODD). The method further includes alternating between programming the first, the second, and the third lower pages (e.g., LP1, LP2, LP3) and the upper page (e.g., UPPER) associated with the even (EVEN) and the odd (ODD) bit lines between a number wordlines (e.g., WL0, WL1, . . . , WL31). As shown in FIG. 3A, beginning with a first wordline WL0, e.g., adjacent to a source line of a NAND array (e.g., source line 123 in FIG. 1), programming is alternated between programming the first, the second, and the third lower page (e.g., LP1, LP2, LP3) and the upper page (e.g., UPPER) for cells associated with the even and the odd bit line between a number of next adjacent wordlines (e.g., WL1, WL2, . . . , WL31).

As shown in the table embodiment of FIG. 3A, the programming sequence begins with a first wordline, e.g., WL0, adjacent to a source line of the NAND array, and is alternated between programming a first, a second, and a third lower page, e.g., LP1, LP2, LP3, and an upper page, e.g., UPPER, for cells associated with an even (EVEN) and an odd (ODD) bit line between a number of next adjacent wordlines. Hence, in one embodiment the method includes programming first lower pages, e.g., page 0 and page 1 (LP1), of the even and the odd bit lines associated with a first wordline, WL0, and next programming first lower pages, e.g., page 2 and page 3 (LP1), of the even and the odd bit lines associated with a second wordline, WL1. Next, the method includes programming second lower pages, e.g., page 4 and page 5 (LP2), of the even and the odd bit lines associated with the first wordline, WL0. Next the method includes programming first lower pages, e.g., page 6 and page 7 (LP1), of the even and the odd bit lines associated with a third wordline, WL2. The method then includes programming second lower pages, e.g., page 8 and page 9 (LP2), of the even and the odd bit lines associated with the second wordline, WL1. The method then continues with programming third lower pages, e.g., page 10 and page 11 (LP3), of the even and the odd bit lines associated with the first wordline, WL0.

According to the embodiment reflected in the table of FIG. 3A, the method includes programming first lower pages, e.g., page 12 and page 13 (LP1), of the even and the odd bit lines associated a fourth wordline, WL3. The method then includes programming second lower pages, e.g., page 14 and page 15 (LP2), of the even and the odd bit lines associated with the third wordline, WL2. Then, programming third lower pages, e.g., page 16 and page 17 (LP3), of the even and the odd bit lines associated with the second wordline, WL1, occurs. Thereafter, upper pages, e.g., page 18 and page 19 (UPPER), of the even and the odd bit lines associated with the first wordline, WL0, are programmed. Next, the first lower pages, e.g., page 20 and page 21 (LP1), of the even and the odd bit lines associated with the fifth wordline, WL4, are programmed. The method then includes programming second lower pages, e.g., page 22 and page 23 (LP2), of the even and the odd bit lines associated with the fourth wordline, WL3. Next, programming the third lower pages, e.g., page 24 and page 25 (LP3), of the even and the odd bit lines associated with the third wordline, WL2, occurs. Then upper pages, e.g., page 26 and page 27 (UPPER), of the even and the odd bit lines associated with the second wordline, WL1, occurs.

The embodiment programming sequence illustrated by the table embodiment of FIG. 3A is continued through subsequent wordlines, e.g. WL5 through WL3.1 in this example. As such, the programming sequence described above for wordlines WL-0 through WL-4 is continued through WL31. Hence, the programming sequence for the embodiment of FIG. 3A repeats for the entire memory block being programmed. As such, the upper pages, e.g., page 254 and page 255 (UPPER), of the even and the odd bit lines associated with the thirty-second wordline (WL31) are programmed last in this sequence.

FIG. 3B illustrates an embodiment for programming a NAND array of four bit non-volatile memory cells on even and odd bit lines 307-0 (BL0) and 307-1 (BL1) according to the programming sequence embodiment of FIG. 3A.

For each cell in the embodiment of FIG. 3B, the lower left number 361 is the first lower page (LP1) of programmed data, the upper left number 362 is the second lower page (LP2) of programmed data, the upper right page 363 is the third lower page (LP3) of programmed data, and the lower right page 365 is the upper page (UP) of programmed data.

The embodiment of FIG. 3B illustrates beginning with a first wordline, e.g., WL0, adjacent to a source select gate (SGS) line 317 of aNAND array and alternating between programming a first, e.g., 361, a second, e.g., 362, and a third lower page, e.g., 363, and an upper page, e.g., 365, for cells associated with even, e.g., BL0, and odd, e.g., BL1, bit lines between a number of next adjacent wordlines, e.g., WL0-WL31

FIG. 3C illustrates a graphic to denote the various lower pages, e.g., 361, 362, 363, and the upper page, e.g., 365, as associated with each cell in the embodiment of FIG. 3B.

As illustrated in the embodiment of FIG. 3B, one method includes programming a first lower page (page 0), 361-0, of the even bit line, BL0, and a first lower page (page 1), e.g., 361-1, of the odd bit line, BL1, associated with a first wordline, e.g., WL0. As shown in FIG. 3B, the embodiment includes next programming a first lower page (page 2), e.g., 361-2, of the even bit line, BL0, and a first lower page (page 3), e.g., 361-3 of the odd bit line, BL1, associated with a second wordline, e.g., WL1. As shown in the embodiment of FIG. 3B, the method includes next programming a second upper page (page 4), e.g., 362-0, of the even bit line, BL0 and a second lower page (page 5), e.g., 362-1, of the odd bit line, BL1, associated with the first wordline, e.g., WL0. As represented in the embodiment of FIG. 3B, the embodiment includes next programming a first lower page (page 6), e.g., 361-4, of even bit line, BL0, and first lower page (page 7), e.g., 361-5, of the odd bit line, BL1, associated with a third wordline, e.g., WL2. The embodiment next includes programming a second lower page (page 8), e.g., 362-2, of the even bit line, BL0, and a second lower page (page 9), e.g., 362-3, of the odd bit line, BL1, associated with the second wordline, e.g., WL1. The method next includes programming a third lower page (page 10), e.g., 363-0, of the even bit line, e.g., BL0, and a third lower page (page 11), e.g., 363-1 of the odd bit line, e.g., BL1, associated with the first wordline, e.g., WL0.

As shown in the embodiment of FIG. 3B, the method next includes programming a first lower page (page 12), e.g., 361-6, of the even bit line, e.g., BL0, and a first lower page (page 13), e.g., 361-7, of the odd bit line, e.g., BL1, associated with a fourth wordline, e.g., WL3. The method continues with programming a second lower page (page 14), e.g., 362-4, of the even bit line, BL0, and a second lower page (page 15), e.g., 362-5, of the odd bit line, e.g., BL1, associated with the third wordline, e.g., WL2. Next, the method includes programming a third lower page (page 16), e.g., 363-2, of the even bit line, e.g., BL0, and a third lower page (page 17), e.g., 363-3, of the odd bit line, e.g., BL1, associated with the second wordline, e.g., WL1. The method continues with programming an upper page (page 18), e.g., 365-0 of the even bit line, e.g., BL0, and an upper page (page 19), e.g., 365-1, of the odd bit line, e.g., BL1, associated with the first wordline, e.g., WL0.

This is followed by programming a second lower page (page 22), e.g., 362-6, of the even bit line, e.g., BL0, and a second lower page (page 23), e.g., 262-7, of the odd bit line, e.g., BL1, associated with the fourth wordline, e.g., WL3. Then a third lower page (page 24), e.g., 363-4, of the even bit line, e.g., BL0, and a third lower page (page 25), e.g., 363-5, of the odd bit line, e.g., BL1, associated with the third wordline, e.g., WL2, is programmed. This is followed by programming an upper page (page 26), e.g., 365-2, of the even bit line, e.g., BL0, and an upper page (page 27), e.g., 365-3, of the odd bit line, e.g., BL1, associated with the second wordline, e.g., WL1.

As such, according to the embodiment shown in FIG. 3B, the first lower pages (pages 0 and 1) of WL0 are programmed first. Next, the first lower pages (pages 2 and 3) of WL1 are programmed. The second lower pages (pages 4 and 5) of WL0 are programmed next. The first lower pages (pages 6 and 7) of WL2 are programmed next. The second lower pages (page 8 and 9) of WL1 are programmed next. The third lower pages (pages 10 and 11) of WL0 are programmed next. The first lower pages (pages 12 and 13) of WL3 are programmed next. The second lower pages (pages 14 and 15) of WL2 are programmed next. The third lower pages (pages 16 and 17) of WL1 are programmed next. The upper pages (pages 18 and 19) of WL0 are programmed next. The first lower pages (pages 20 and 21) of WL-4 (not shown) are programmed next. The second lower pages (pages 22 and 23) of WL3 are programmed next. The third lower pages (pages 24 and 25) of WL2 are programmed next. The upper pages (pages 26 and 27) of WL1 are programmed next. The programming sequence for the embodiment of FIG. 3B repeats for the entire memory block being programmed. As such, the upper pages (pages 254 and 255) of WL31 are programmed last in this sequence.

Figure 4:
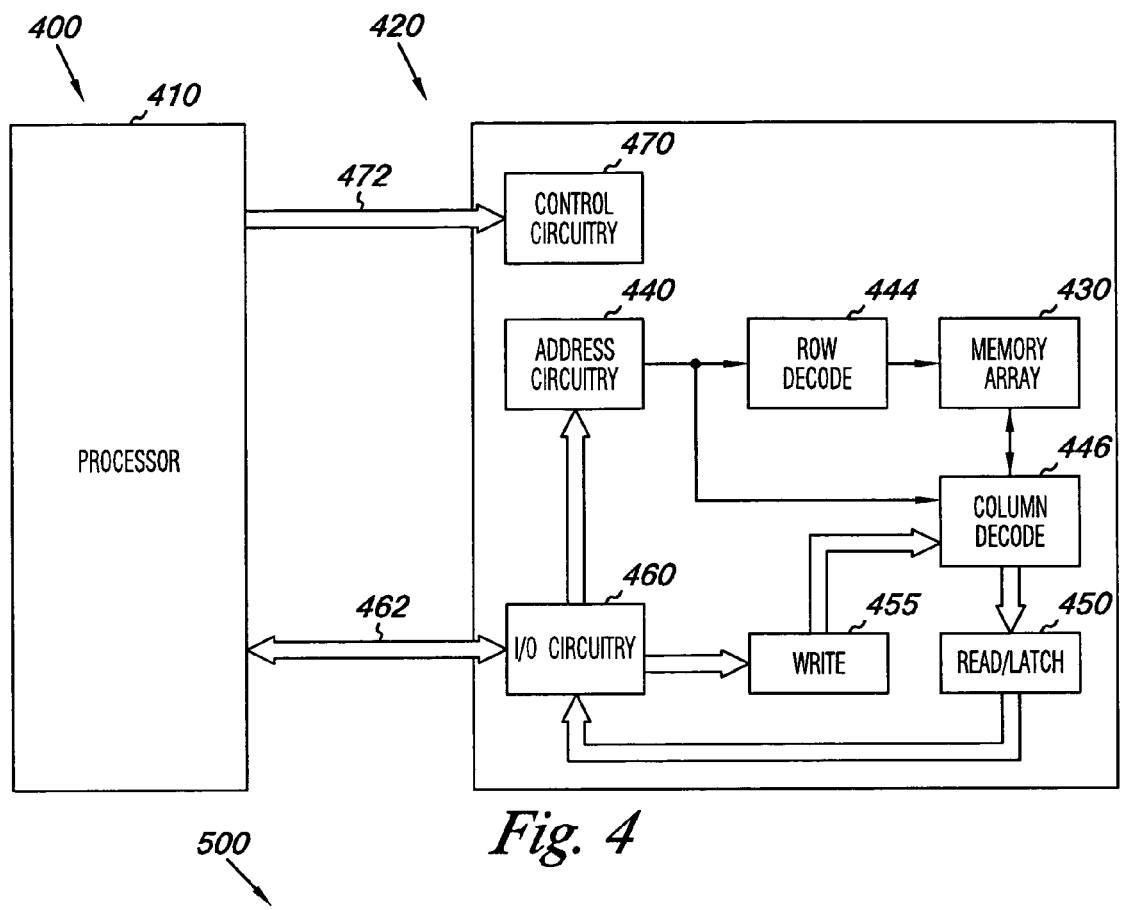

FIG. 4 is a functional block diagram of an electronic memory system having at least one memory device in accordance with an embodiment of the present disclosure. Memory system 400 includes a processor 410 coupled to a non-volatile memory device 420 that includes a memory array 430 of non-volatile cells. The memory system 400 can include separate integrated circuits or both the processor 410 and the memory device 420 can be on the same integrated circuit. The processor 410 can be a microprocessor or some other type of controlling circuitry such as an application-specific integrated circuit (ASIC).

For clarity, the electronic memory system 400 has been simplified to focus on features with particular relevance to the present disclosure. The memory device 420 includes an array of non-volatile memory cells 430, which can be floating gate flash memory cells with a NAND architecture. The control gates of each row of memory cells are coupled with a wordline, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 4 includes address circuitry 440 to latch address signals provided over I/O connections 462 through I/O circuitry 460. Address signals are received and decoded by a row decoder 444 and a column decoder 446 to access the memory array 430. In light of the present disclosure, it will be appreciated by those skilled in the art that the number of address input connections depends on the density and architecture of the memory array 430 and that the number of addresses increases with both increased numbers of memory cells and increased numbers of memory blocks and arrays.

The memory array 430 of non-volatile cells can include non-volatile multilevel memory cells programmed according to embodiments described herein. The memory device 420 reads data in the memory array 430 by sensing voltage and/or current changes in the memory array columns using sense/buffer circuitry that in this embodiment can be read/latch circuitry 450. The read/latch circuitry 450 can be coupled to read and latch a row of data from the memory array 430. I/O circuitry 460 is included for bi-directional data communication over the I/O connections 462 with the processor 410. Write circuitry 455 is included to write data to the memory array 430.

Control circuitry 470 decodes signals provided by control connections 472 from the processor 410. These signals can include chip signals, write enable signals, and address latch signals that are used to control the operations on the memory array 430, including data read, data write, and data erase operations. In various embodiments, the control circuitry 470 is responsible for executing instructions from the processor 410 to perform the operating and programming embodiments of the present disclosure. The control circuitry 470 can be a state machine, a sequencer, or some other type of controller. It will be appreciated by those skilled in the art that additional circuitry and control signals can be provided, and that the memory device detail of FIG. 4 has been reduced to facilitate ease of illustration.

Figure 5:
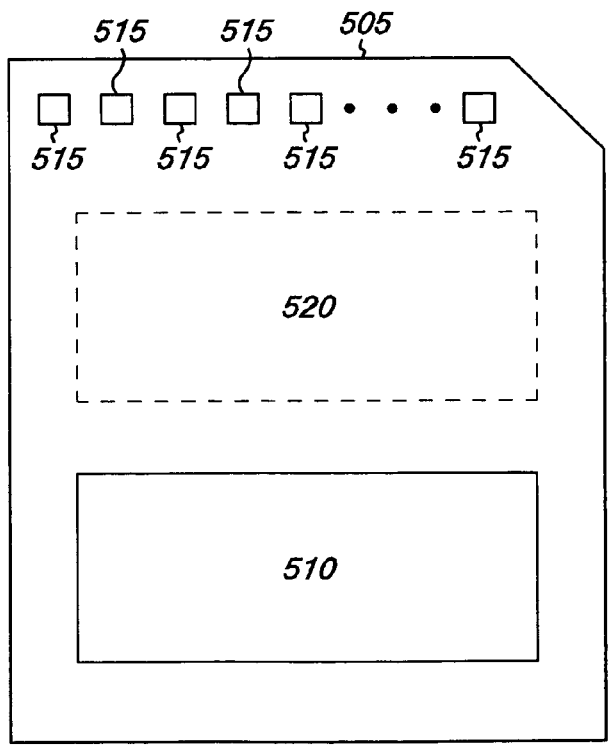
FIG. 5 is a functional block diagram of a memory module having at least one memory device in accordance with an embodiment of the present disclosure.

FIG. 5 is a functional block diagram of a memory module having at least one memory device in accordance with an embodiment of the present disclosure. Memory module 500 is illustrated as a memory card, although the concepts discussed with reference to memory module 500 are applicable to other types of removable or portable memory (e.g., USB flash drives) and are intended to be within the scope of "memory module" as used herein. In addition, although one example form factor is depicted in FIG. 5, these concepts are applicable to other form factors as well.

In some embodiments, memory module 500 will include a housing 505 (as depicted) to enclose one or more memory devices 510, though such a housing is not essential to all devices or device applications. At least one memory device 510 includes an array of non-volatile multilevel memory cells programmed according to embodiments described herein. Where present, the housing 505 includes one or more contacts 515 for communication with a host device. Examples of host devices include digital cameras, digital recording and playback devices, PDAs, personal computers, memory card readers, interface hubs and the like. For some embodiments, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on CompactFlash T memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520, which may be one or more integrated circuits and/or discrete components. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of 510 connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC. Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

Methods, devices, modules, and systems for programming multilevel non-volatile memory cells have been shown. Each cell includes a number of lower pages and an upper page. One method embodiment includes programming an array of non-volatile multilevel memory cells to a number of threshold voltage ranges, wherein each of the number of threshold ranges represents a different logical state. The method includes programming a lower page of a first wordline cell to increase a threshold voltage (Vt) of the first wordline cell to a first Vt within a lowermost Vt range, programming a lower page of a second wordline cell prior to programming an upper page of the first wordline cell, and programming the upper page of the first wordline cell such that the first Vt is increased to a second Vt, wherein the second Vt is within a Vt range which is then a lowermost Vt range.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for programming an array of non-volatile multilevel memory cells to a number of threshold voltage ranges, the method comprising:
   programming selected cells in a NAND string that have a negative threshold voltage (Vt) level to two bit states; and
   subsequently programming selected cells in the NAND string to four bit states wherein all states have positive Vt levels.

2. The method of claim 1, wherein programming the selected cells to two bit states includes increasing the Vt level of the selected cells to within one of four positive Vt ranges.

3. The method of claim 1, wherein subsequently programming selected cells to four bit states includes increasing the Vt level of the selected cells to within one of sixteen positive Vt ranges.

4. The method of claim 1, wherein each selected cell has an associated number of lower pages and an upper page, and wherein programming selected cells to two bit states includes performing a first and a second lower page programming operation on the selected cells.

5. The method of claim 4, wherein subsequently programming selected cells to four bit states includes performing a third lower page programming operation and an upper page programming operation on the selected cells.

6. A method for programming an array of non-volatile multilevel memory cells to a number of threshold voltage ranges, the method comprising:
   programming a lower page of a first wordline cell to increase a threshold voltage (Vt) of the first wordline cell to a first Vt within a lowermost Vt range;
   programming a lower page of a second wordline cell prior to programming an upper page of the first wordline cell; and
   programming the upper page of the first wordline cell such that the first Vt is increased to a second Vt, wherein the second Vt is within a Vt range which is then a lowermost Vt range and is positive.

7. The method of claim 6, wherein programming the lower page of the first wordline cell includes increasing the Vt of the first wordline cell from a negative Vt to the first Vt.

8. The method of claim 6, wherein programming the lower page of the first wordline cell includes:
   performing a compaction verify operation on the first wordline cell when a verify voltage associated with the lowermost Vt range is not greater than zero volts; and
   performing a program verify operation on the first wordline cell when the verify voltage associated with the lowermost Vt range is at least zero volts.

9. The method of claim 8, wherein programming the upper page of the first wordline cell includes performing a program verify operation on the first wordline cell when the second Vt and a verify voltage associated with the Vt range which is then the lowermost Vt range are at least zero volts 10. The method of claim 6, wherein the method includes programming a second lower page and a third lower page of the first wordline cell prior to programming the upper page of the first wordline cell.

11. The method of claim 6, wherein the method includes programming a lower page of a second first wordline cell after programming the lower page of the first wordline cell and prior to programming the upper page of the first wordline cell to the second Vt within the Vt range which is then the lowermost Vt range.

12. A method for programming an array of non-volatile multilevel memory cells to a number of threshold voltage ranges, the method comprising:
   programming a first lower page of a first group of first wordline cells, such that a threshold voltage (Vt) of at least one of the first group of first wordline cells is increased from an initial Vt to a first Vt within a lowermost Vt range;
   programming a second lower page of the first group of first wordline cells, such that the first Vt is increased to a second Vt, wherein the second Vt is within a Vt range which is then a lowermost Vt range;
   programming a third lower page of the first group of first wordline cells such that the second Vt is increased to a third Vt, wherein the third Vt is within a Vt range which is then a lowermost Vt range; and
   programming an upper page of the first group of first wordline cells such that the third Vt is increased to a fourth Vt, wherein the fourth Vt is within a Vt range which is then a lowermost Vt range.

13. The method of claim 12, wherein programming the upper page includes increasing the third Vt to a fourth Vt that is a positive voltage, and wherein the then lowermost Vt range represents a four bit logical state.

14. The method of claim 12, wherein programming the third lower page includes increasing the second Vt to a third Vt that is a positive voltage, and wherein a verify voltage associated with the then lowermost Vt range is greater than zero volts.

15. The method of claim 12, wherein programming the upper page includes programming the upper page of the first group of wordline cells such that each of the first group of first wordline cells has a Vt greater than zero volts, and wherein each of the first group of first wordline cells has an initial Vt that is no greater than zero volts.

16. The method of claim 12, wherein the first wordline is adjacent to a source line of the array, and wherein the method includes programming a first lower page of cells on at least a first next adjacent wordline and a second next adjacent wordline prior to programming the upper page of the first group of first wordline cells.

17. A method for programming an array of non-volatile multilevel memory cells to a number of threshold voltage ranges, the method comprising:
   programming a first lower page of a first group of first wordline cells, wherein at least one cell of the first group of first wordline cells is to be programmed to a threshold voltage within a lowermost threshold voltage range of the number of threshold voltage ranges;
   programming a second lower page of the first group of first wordline cells;
   programming a third lower page of the first group of first wordline cells; and
   programming an upper page of the first group of first wordline cells, wherein the upper page programming includes applying a number of programming voltage pulses to the first wordline until the at least one of the first number of first wordline cells to be programmed to a threshold voltage within the lowermost threshold voltage range reaches a positive threshold voltage.

18. The method of claim 17, wherein programming the first lower page of the first group of first wordline cells includes:
   performing a first lower page compaction verify operation on the at least one of the first group of first wordline cells to be programmed to a threshold voltage within the lowermost threshold voltage range; and
   performing a first lower page program verify operation on the first group of first wordline cells to be programmed to a threshold voltage within a threshold voltage range other than the lowermost threshold voltage range.

19. The method of claim 18, wherein programming the first lower page of the first group of first wordline cells includes:
   performing the first lower page compaction verify operation by applying a ground potential to a bit line associated with the cells to be programmed to a threshold voltage within the lowermost threshold voltage range and applying a potential of about 1 volt to a source line of the array; and
   performing the first lower page program verify operation by applying a ground potential to the source line and a potential of about 1 volt to bit lines associated with the cells to be programmed to a threshold voltage within a threshold voltage range other than the lowermost threshold voltage range.

20. The method of claim 18, wherein programming the upper page of the first group of first wordline cells includes:
   performing an upper page program verify operation on the at least one of the first group of first wordline cells to be programmed to a threshold voltage within the lowermost threshold voltage range; and
   performing the upper page program verify operation on each of the first group of first wordline cells to be programmed to a threshold voltage within a threshold voltage range other than the lowermost threshold voltage range.

21. The method of claim 20, wherein:
   programming the second lower page of the first group of first wordline cells includes:
      performing a second lower page compaction verify operation on the at least one of the first group of first wordline cells to be programmed to a threshold voltage within the lowermost threshold voltage range; and
      performing a second lower page program verify operation on the first group of first wordline cells to be programmed to a threshold voltage within a threshold voltage range other than the lowermost threshold voltage range; and
   programming the third lower page of the first group of first wordline cells includes:
      performing a third lower page program verify operation on the at least one of the first group of first wordline cells to be programmed to a threshold voltage within the lowermost threshold voltage range; and
      performing the third lower page program verify operation on each of the first group of first wordline cells to be programmed to a threshold voltage within a threshold voltage range other than the lowermost threshold voltage range.

22. The method of claim 21, wherein the third lower page programming includes applying a number of programming voltage pulses to the first wordline until the at least one of the first number of first wordline cells to be programmed to a threshold voltage within the lowermost threshold voltage range reaches a positive threshold voltage.

23. The method of claim 17, wherein the method includes programming a NAND array of n-channel multilevel memory cells in which each cell is a 4 bit cell being programmed to a positive threshold voltage within one of 16 different positive threshold voltage ranges.

24. The method of claim 17, wherein the first wordline is adjacent to a source line of the array, and wherein the method includes programming a first lower page of cells on at least a first next adjacent wordline and a second next adjacent wordline prior to programming the upper page of the first group of first wordline cells.

25. The method of claim 24, wherein the method includes programming the first lower page of cells on at least the first next adjacent wordline and the second next adjacent wordline prior to programming the third lower page of the first group of first wordline cells.

26. A method for programming a NAND array of non-volatile multilevel memory cells to a number of different threshold voltage ranges, wherein each of the number of different threshold voltage ranges represents a different logical state, and wherein each cell has an associated number of lower pages and an upper page, the method comprising:
   programming a first lower page of a first group of first wordline cells, wherein prior to the first lower page programming, the first group of first wordline cells each have an initial threshold voltage within a lowermost threshold voltage range, wherein the lowermost threshold voltage range includes negative voltages;
   programming a second lower page of the first group of first wordline cells;
   programming a third lower page of the first group of first wordline cells; and
   programming an upper page of the first group of first wordline cells;
   wherein at least one of the first, second, and third lower page and the upper page programming of the first group of first wordline cells includes:
      applying a number of programming voltage pulses to a control gate of each cell being programmed to the logical state represented by the lowermost threshold voltage range until each cell has reached a positive threshold voltage; and
      verifying that each cell being programmed to the logical state represented by the lowermost threshold voltage range has reached a positive threshold voltage within the lowermost threshold voltage range by applying a verify voltage of at least 0 volts to the control gate.

27. The method of claim 26, wherein the method includes subsequently programming a first lower page of a first group of second wordline cells prior to programming an upper page of the first group of first wordline cells, the second wordline adjacent the first wordline and the first group of second wordline cells sharing bit lines with the first group of first wordline cells.

28. The method of claim 27, wherein the first wordline is adjacent to a source line of the NAND array, and wherein the method includes:
programming a second lower page of the first group of second wordline cells prior to programming the upper page of the first group of first wordline cells; and
programming a first lower page of a first group of third wordline cells prior to programming the second lower page of the on at least a second next adjacent wordline and a second next adjacent wordline prior to programming the upper page of the first group of first wordline cells.

29. The method of claim 26, wherein programming the first, second, and third lower pages includes performing a compaction verify operation on cells being programmed to the logical state represented by the lowermost threshold voltage range if the cells have not reached a positive threshold voltage, and wherein the lowermost threshold voltage range represents an erase state.

30. A non-volatile memory device comprising:
an array of non-volatile multilevel memory cells arranged in rows coupled by wordlines and columns coupled by bit lines; and
control circuitry coupled to the array of memory cells and configured to execute a method for programming data into a number of lower pages and an upper page associated with the memory cells, wherein the method includes:
programming a first lower page of a first group of first wordline cells, wherein each of the first group of first wordline cells has an initial threshold voltage within a lowermost threshold voltage range of a number of different threshold voltage ranges corresponding to a number of different logical states;
subsequently programming a second and a third lower page and an upper page of the first group of first wordline cells, wherein at least one of the first, second, and third lower page and the upper page programming of the first group of first wordline cells includes:
applying a number of programming voltage pulses to a control gate of each cell being programmed to the logical state corresponding to the lowermost threshold voltage range until each cell has reached a positive threshold voltage; and
verifying that each cell being programmed to the logical state corresponding to the lowermost threshold voltage range has reached a positive threshold voltage within the lowermost threshold voltage range by applying a verify voltage of at least 0 volts to the control gate.

31. The device of claim 30, wherein the initial threshold voltage is a negative voltage.

32. The device of claim 30, wherein the device is a NAND array of multilevel memory cells each programmed from an initial threshold voltage not greater than 0 volts to a threshold voltage not less than 0 volts within one of sixteen different positive voltage ranges representing sixteen different logical states.

33. The device of claim 30, wherein the first wordline is adjacent to a source line of the array, and wherein the method includes:
programming a first lower page of cells on at least a first next adjacent wordline, a second next adjacent wordline, and a third next adjacent wordline prior to programming the upper page of the first group of first wordline cells;
programming a second lower page of cells on at least the first next adjacent wordline and the second next adjacent wordline prior to programming the upper page of the first group of first wordline cells; and
programming a third lower page of cells on at least the first next adjacent wordline prior to programming the upper page of the first group of first wordline cells.

34. A non-volatile memory device comprising:
a NAND array of non-volatile multilevel memory cells arranged in rows coupled by wordlines and columns coupled by bit lines, each cell having a number of lower pages and an upper page; and
control circuitry coupled to the array of memory cells and configured to execute a method for programming data that includes:
beginning with a first wordline adjacent to a source line of the NAND array, alternating between programming a first, a second, and a third lower page and an upper page for cells associated with an even and an odd bit line;
programming the first, second, and third lower pages for cells associated with the even and the odd bit lines of a first next adjacent wordline prior to programming the upper pages for cells of the even and odd bit lines of the first wordline adjacent to the source line; and
wherein at least one of the first, second, and third lower page and the upper page programming for cells of the first wordline and cells of next adjacent wordlines includes:
applying a number of programming voltage pulses to a control gate of each cell being programmed to a logical state corresponding to a lowermost threshold voltage range until each cell has reached a positive threshold voltage; and
verifying that each cell being programmed to the logical state corresponding to the lowermost threshold voltage range has reached a positive threshold voltage within the lowermost threshold voltage range by applying a verify voltage of at least 0 volts to the control gate.

35. The device of claim 34, wherein the method includes:
programming first lower pages of the even and the odd bit lines associated with the first wordline;
next, programming first lower pages of the even and the odd bit lines associated with the first next adjacent wordline;
next, programming second lower pages of the even and the odd bit lines associated with the first wordline;
next, programming first lower pages of the even and the odd bit lines associated with a second next adjacent wordline;
next, programming second lower pages of the even and the odd bit lines associated with the first next adjacent wordline; and
next, programming third lower pages of the even and the odd bit lines associated with the first wordline.

36. The device of claim 35, wherein the method includes:
programming first lower pages of the even and the odd bit lines associated with a third next adjacent wordline;

programming second lower pages of the even and the odd bit lines associated with the second next adjacent wordline;

programming third lower pages of the even and the odd bit lines associated with the first next adjacent wordline;

programming upper pages of the even and the odd bit lines associated with the first wordline; and next, programming first lower pages of the even and the odd bit lines associated with a fourth next adjacent wordline.

37. A method for programming a NAND array of non-volatile multilevel memory cells to a particular number of data states, the method comprising:

performing a lower page programming process on a number of cells coupled to a particular wordline, wherein the lower page programming process increases a threshold voltage (Vt) of each of the number of cells from a negative Vt to one of a number of Vt levels corresponding to a number of data states;

subsequently performing an upper page programming process on the number of cells, wherein the upper page programming process programs the number of cells to one of at least sixteen different data states, and wherein each of the Vts corresponding to each of the at least sixteen different data states are positive Vts.

38. The method of claim 37, wherein the method includes performing at least a second and a third lower page programming process prior to performing the upper page programming process.

* * * * *

UNITED STATES PATENT AND TRADEMARK OFFICE
CERTIFICATE OF CORRECTION

PATENT NO. : 7,539,052 B2
APPLICATION NO. : 11/646815
DATED : May 26, 2009
INVENTOR(S) : Seiichi Aritome Page 1 of 1

It is certified that error appears in the above-identified patent and that said Letters Patent is hereby corrected as shown below:

In column 18, line 20, in Claim 9, delete "volts" and insert -- volts. --, therefor.

In column 20, line 24, in Claim 23, delete "16different" and insert -- 16 different --, therefor.

Signed and Sealed this

Eleventh Day of August, 2009

David J. Kappos
*Director of the United States Patent and Trademark Office*